(12) United States Patent
Lee et al.

(10) Patent No.: US 12,046,564 B2
(45) Date of Patent: *Jul. 23, 2024

(54) METHOD AND DEVICE FOR REDUCING METAL BURRS WHEN SAWING SEMICONDUCTOR PACKAGES

(71) Applicant: STATS ChipPAC Pte. Ltd., Singapore (SG)

(72) Inventors: HunTeak Lee, Gyeongi-do (KR); Deokkyung Yang, Incheon Si (KR); HeeSoo Lee, Kyunggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/309,951

(22) Filed: May 1, 2023

(65) Prior Publication Data

US 2023/0268289 A1 Aug. 24, 2023

Related U.S. Application Data

(60) Continuation of application No. 17/645,257, filed on Dec. 20, 2021, now Pat. No. 11,676,911, which is a division of application No. 16/181,619, filed on Nov. 6, 2018, now Pat. No. 11,244,908.

(51) Int. Cl.
| | |
|---|---|
| *H01L 23/552* | (2006.01) |
| *H01L 21/56* | (2006.01) |
| *H01L 21/78* | (2006.01) |
| *H01L 23/00* | (2006.01) |
| *H01L 23/31* | (2006.01) |

(52) U.S. Cl.
CPC ............ *H01L 23/552* (2013.01); *H01L 21/56* (2013.01); *H01L 21/78* (2013.01); *H01L 23/3107* (2013.01); *H01L 24/09* (2013.01); *H01L 24/17* (2013.01)

(58) Field of Classification Search
CPC ......... H01L 21/4803–481; H01L 21/78; H01L 23/12–147
See application file for complete search history.

(56) References Cited

U.S. PATENT DOCUMENTS

| | | | | |
|---|---|---|---|---|
| 5,572,779 | A * | 11/1996 | Adelman | ............... H05K 3/403 29/874 |
| 7,312,107 | B2 | 12/2007 | Noma et al. | |
| 7,511,379 | B1 * | 3/2009 | Flint, Jr. | ........... H01L 21/76898 257/730 |

(Continued)

*Primary Examiner* — Vincent Wall
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. A conductive layer is formed over the substrate and includes a ground plane. A first tab of the conductive layer extends from the ground plane and less than half-way across a saw street of the substrate. A shape of the first tab can include elliptical, triangular, parallelogram, or rectangular portions, or any combination thereof. An encapsulant is deposited over the substrate. The encapsulant and substrate are singulated through the saw street. An electromagnetic interference (EMI) shielding layer is formed over the encapsulant. The EMI shielding layer contacts the first tab of the conductive layer.

20 Claims, 11 Drawing Sheets

(56) References Cited

U.S. PATENT DOCUMENTS

| | | | |
|---|---|---|---|
| 8,017,942 B2 * | 9/2011 | Mariani | H01L 21/78 |
| | | | 257/E23.179 |
| 8,426,946 B2 | 4/2013 | Sasaki et al. | |
| 8,508,023 B1 | 8/2013 | Kelly et al. | |
| 2009/0302435 A1 | 12/2009 | Pagaila et al. | |
| 2014/0008779 A1 | 1/2014 | Okuno et al. | |

\* cited by examiner

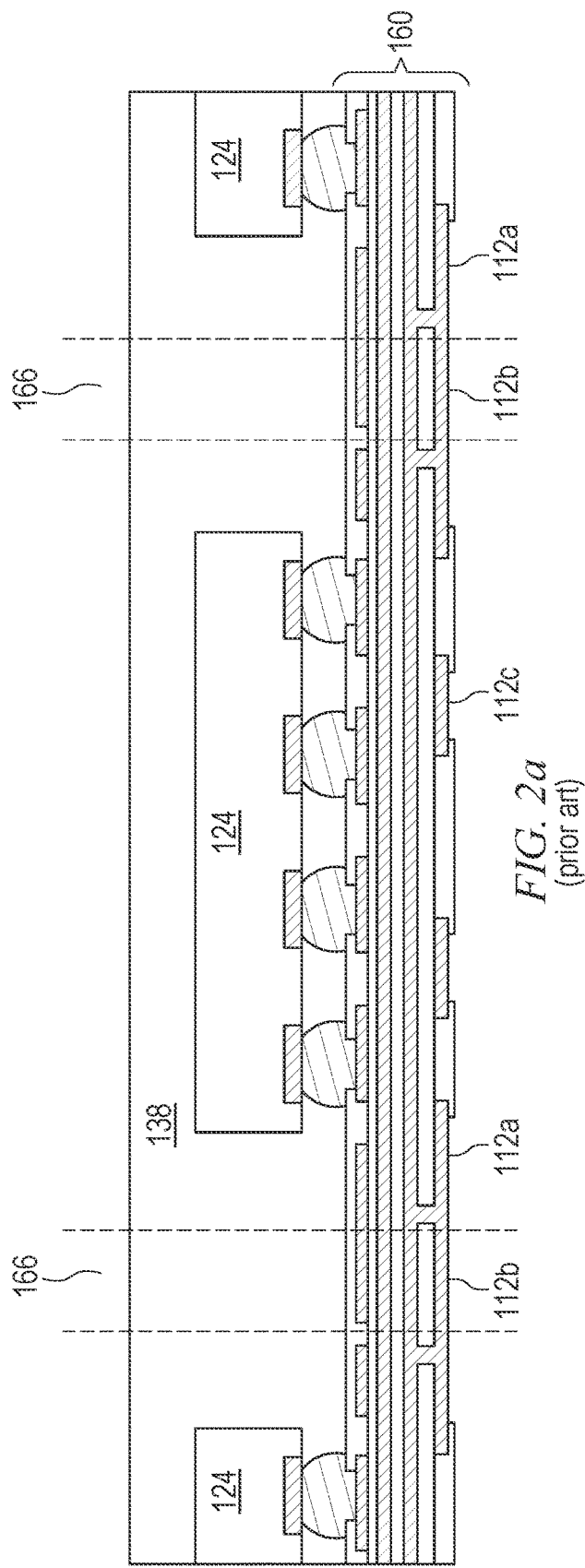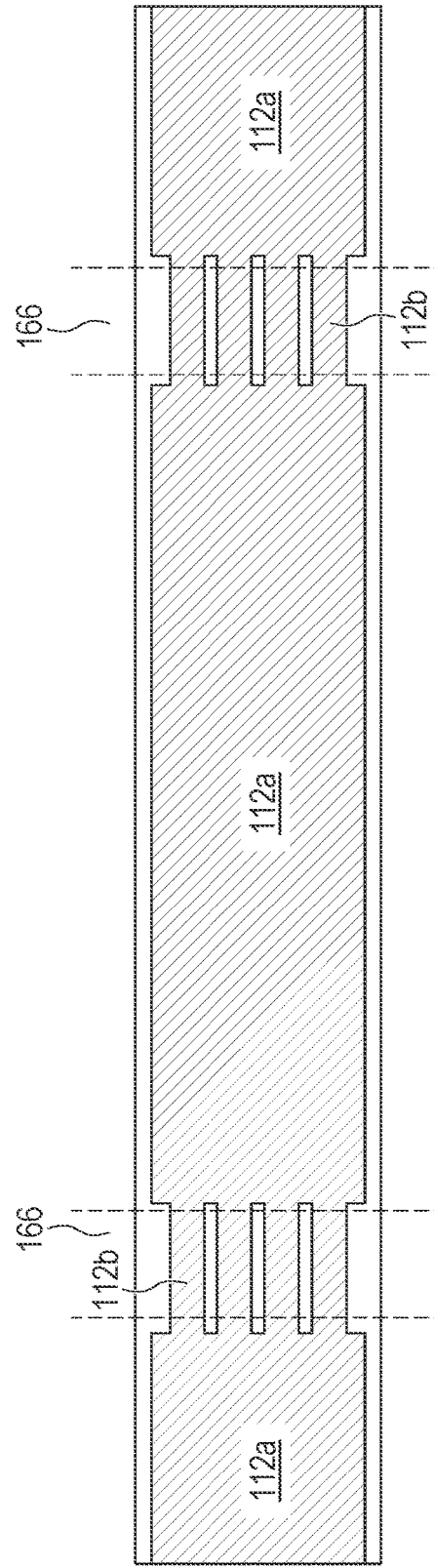
FIG. 2a (prior art)
FIG. 2b (prior art)

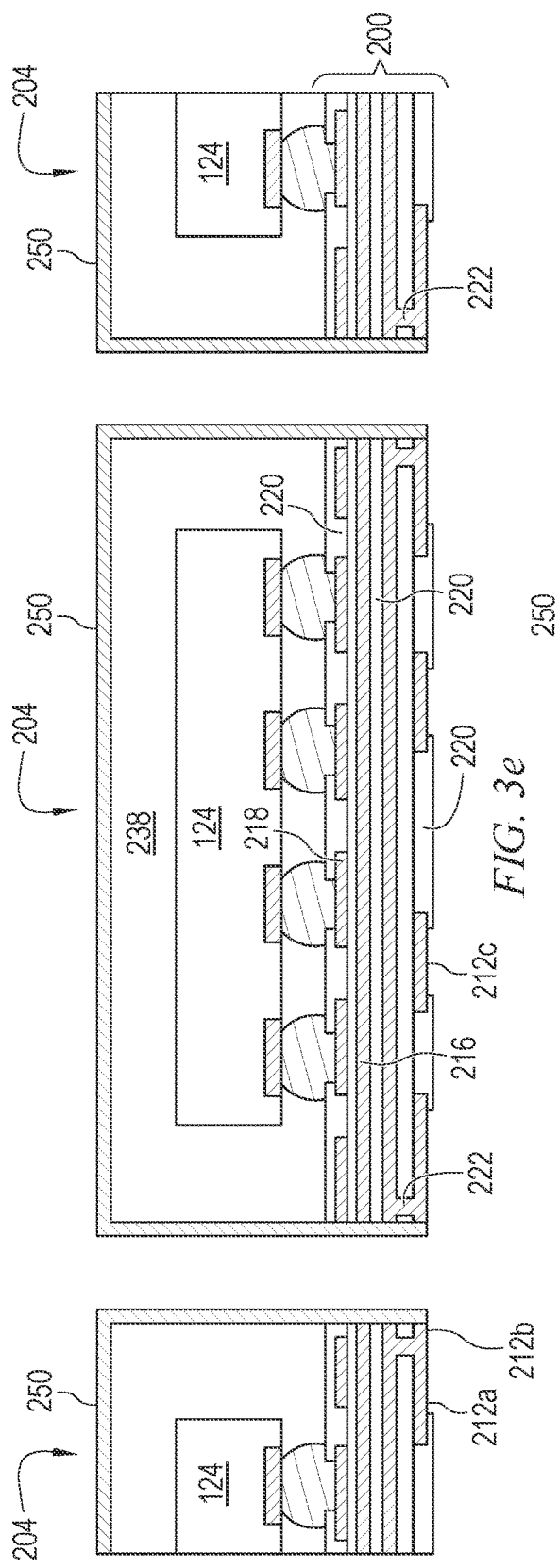
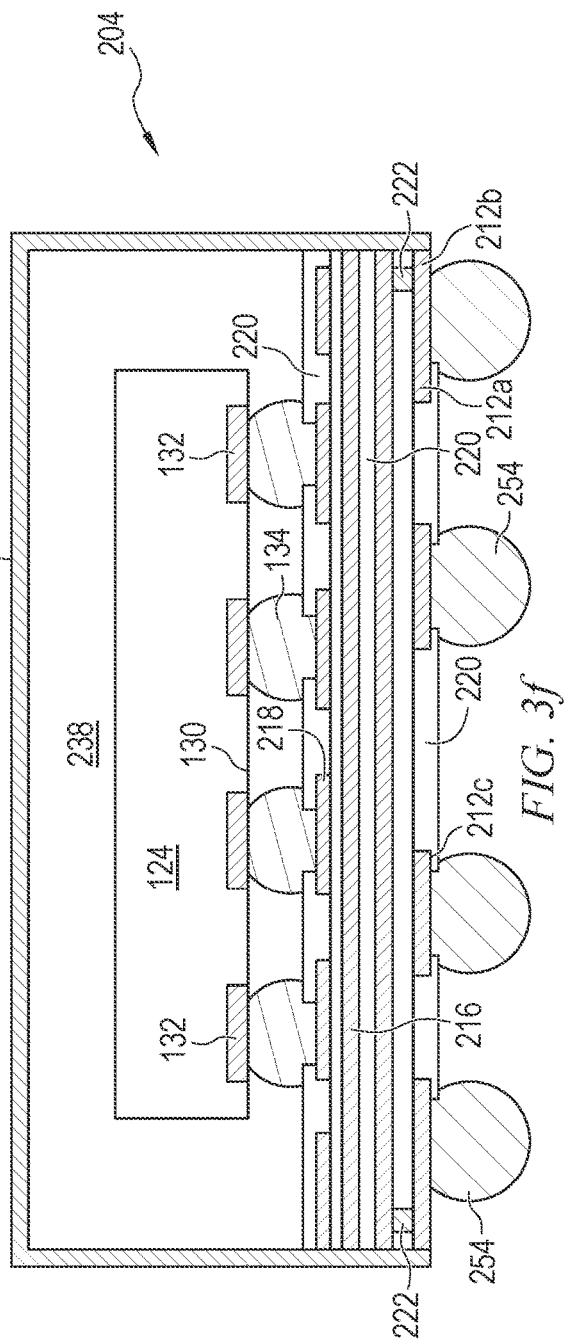

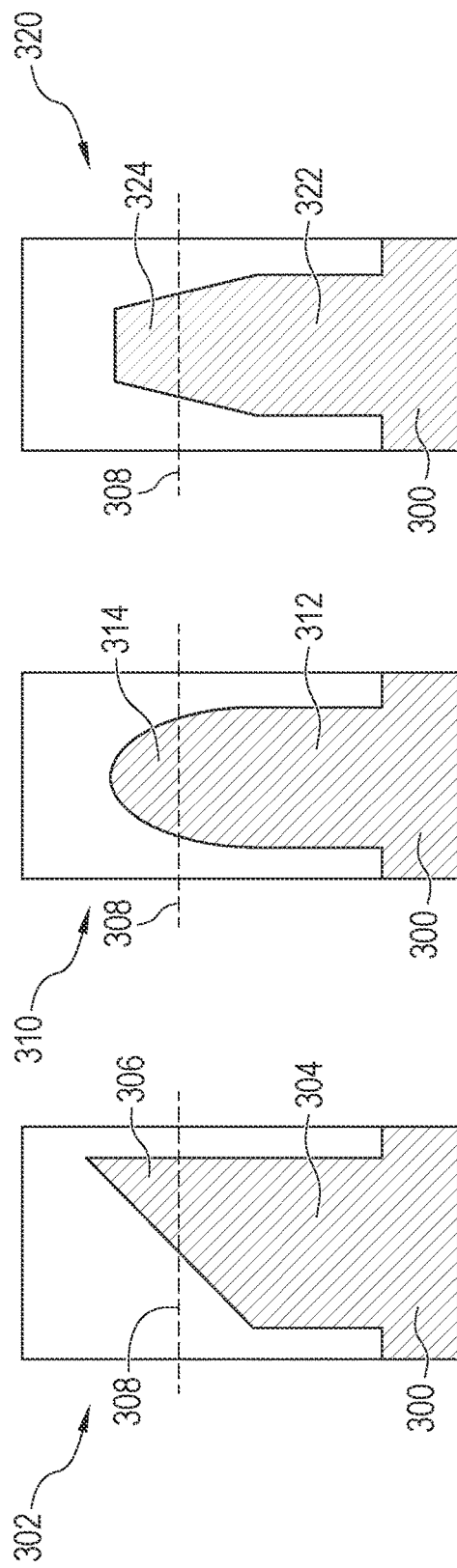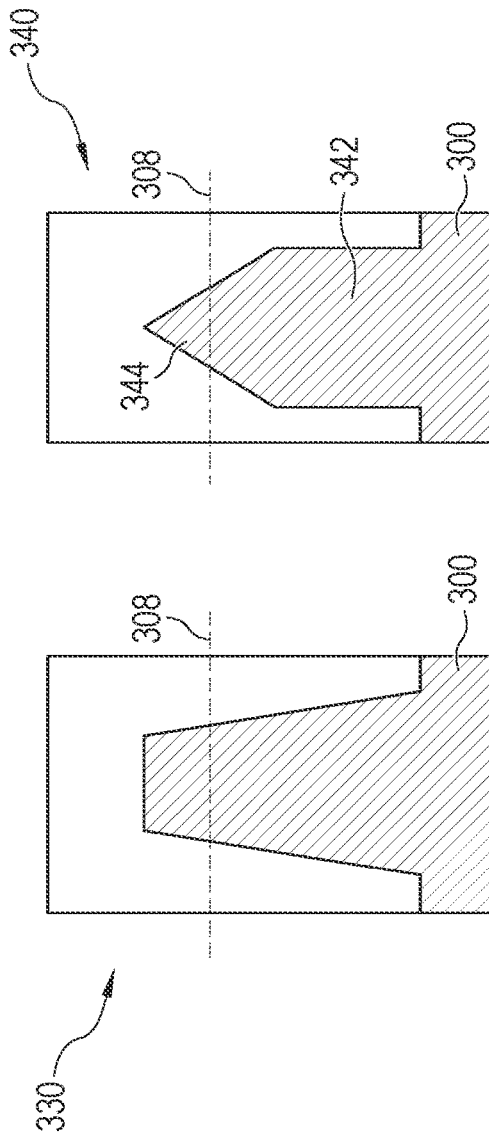

METHOD AND DEVICE FOR REDUCING METAL BURRS WHEN SAWING SEMICONDUCTOR PACKAGES

CLAIM OF DOMESTIC PRIORITY

The present application is a continuation of U.S. patent application Ser. No. 17/645,257, now U.S. Pat. No. 11,676,911, filed Dec. 20, 2021, which is a division of U.S. patent application Ser. No. 16/181,619, now U.S. Pat. No. 11,244,908, filed Nov. 6, 2018, which applications are incorporated herein by reference.

FIELD OF THE INVENTION

The present invention relates in general to semiconductor devices and, more particularly, to methods and devices for reducing metal burrs when sawing semiconductor packages.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices commonly include semiconductor packages with shielding layers to block electromagnetic interference (EMI). FIG. 1 illustrates one topology of a semiconductor package 100 having a conformal shielding layer. The package is based on a unit substrate 110 having conductive layers 112, 114, 116, and 118 interleaved between insulating layers 120. Conductive layers 112, 114, 116, and 118 include contact pads and conductive traces as necessary to implement the desired signal routing. Conductive vias 122 are formed between any of the conductive layers 112-118 to provide vertical signal routing.

Package 100 is formed on unit substrate 110 by mounting any desired electrical components, e.g., semiconductor die 124, onto the substrate. Semiconductor die 124 includes an active surface 130 with contact pads 132. Contact pads 132 are electrically and mechanically connected to conductive layer 118 of unit substrate 110 by solder bumps 134. An encapsulant or molding compound 138 is deposited over unit substrate 110 and semiconductor die 124 for physical support and environmental protection. Solder bumps 144 are formed on conductive layer 112 for subsequent integration of package 100 into a larger electrical system.

An EMI shielding layer 150 is formed over unit substrate 110 and encapsulant 138. Conductive layer 112 extends from one or more bumps 144 to the edge of unit substrate 110. EMI shield 150 contacts the outside ends of conductive layer 112, which connects the EMI shield to ground through bumps 144. Conductive layer 112 includes a ground plane in some embodiments with openings in the ground plane for signal contact pads.

FIGS. 2a-2d illustrate a method of forming semiconductor package 100. FIG. 2a shows a partial cross-section of substrate strip 160 with several semiconductor die 124 mounted on the substrate strip and separated by saw streets 166. Conductive layer 112 includes ground plane 112a, bridges 112b, and contact pads 112c. FIG. 2b is a simplified view of the bottom of substrate strip 160 showing ground plane 112a and bridges 112b. Contact pads 112c for electrical interconnect are formed in openings of, or outside the footprint of, ground plane 112a to electrically isolate the signal paths from ground.

Conductive layer 112 is made continuous across each unit by having bridges 112b connecting adjacent ground planes 112a to each other. That way, when the panel is singulated as shown in FIGS. 2c and 2d, bridges 112b are exposed at side surfaces of unit substrates 110 for connection to EMI shield 150. However, the physical movement of saw blade 170 against the material of conductive layer 112 causes some of the material to move out of the saw's kerf without being physically separated from the conductive layer, forming burrs 174.

Burrs 174 are caused by the mechanical load of saw 170 moving metal from conductive layer 112, due to ductility of the material, without fully removing the metal from the unit substrates 110. Burrs 174 can extend to nearby conductors and cause a short circuit to ground, potentially resulting in part failure. There are also many other potential reliability problems when burrs 174 are present. Moreover, some of the material of conductive layer 112 is pushed laterally out of saw streets 166, resulting in a thickening of the conductive layer around the edges of the device.

Many reliability issues exist for substrates that have ground conductors exposed at saw streets for connection to EMI shielding. Therefore, a need exists for improvements to EMI shielding.

BRIEF DESCRIPTION OF THE DRAWINGS

FIGS. 2a-2d illustrate sawing through the substrate to form the packages, which results in burrs formed along the substrate edges;

FIGS. 3a-3f illustrate a process of forming shielded packages with a non-contiguous grounding layer in the substrate to reduce burrs;

FIGS. 6a-6e illustrate grounding tabs of various shapes; and

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form and, accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
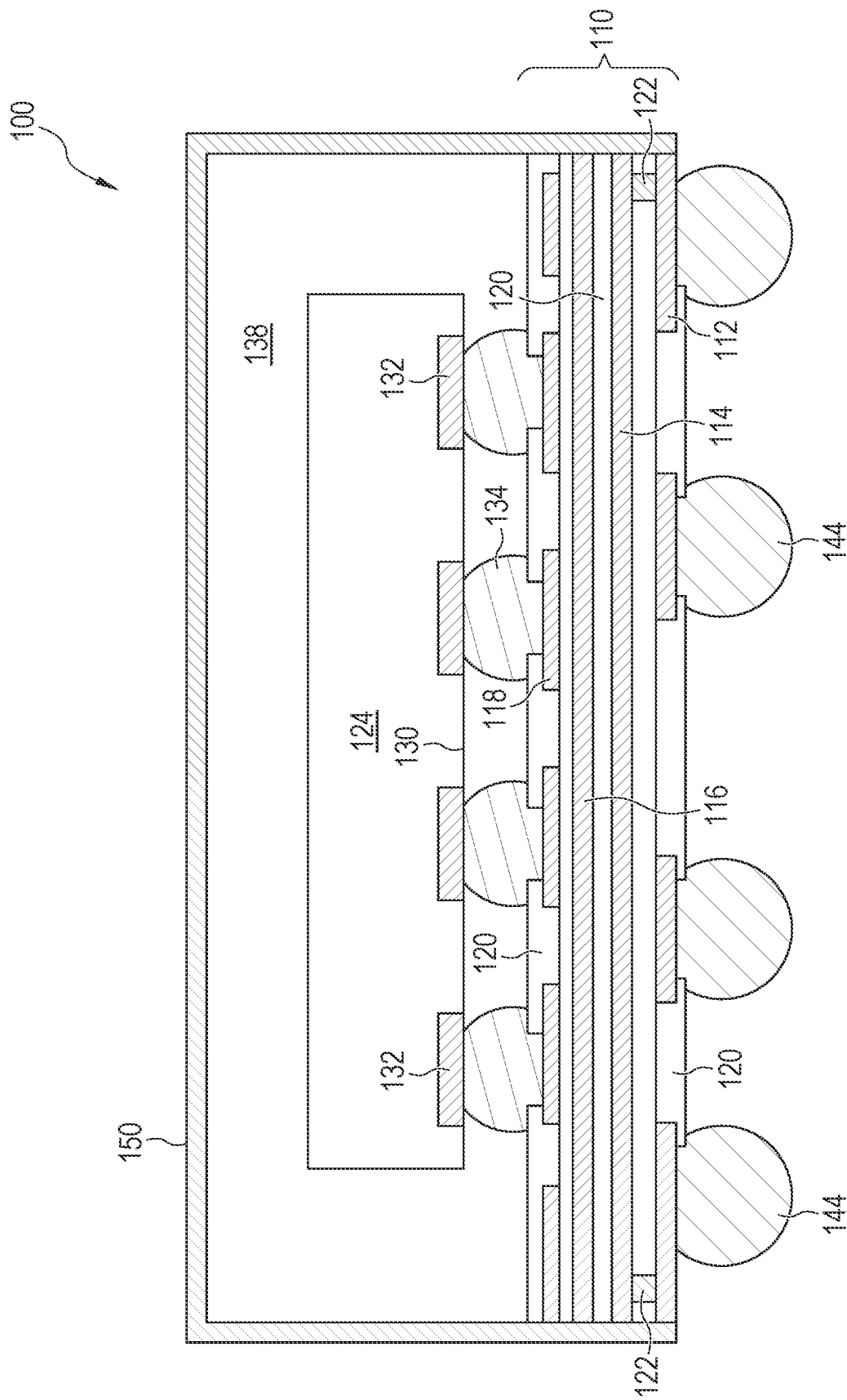
FIG. 1 illustrates a semiconductor package with a conformally applied EMI shielding layer contacting metal layers in a package substrate.
Figures 2C, 2D:
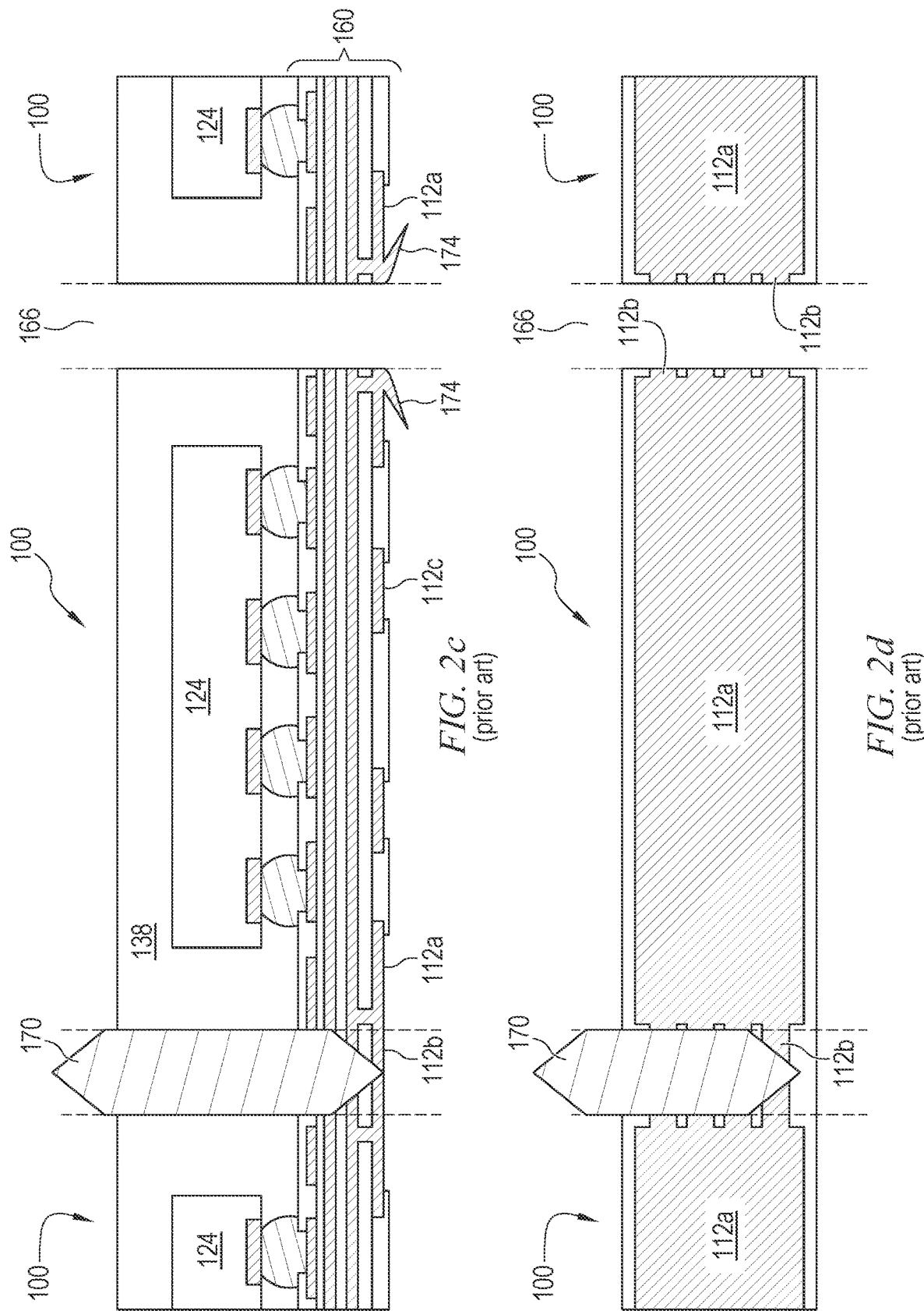
Figure 3A:
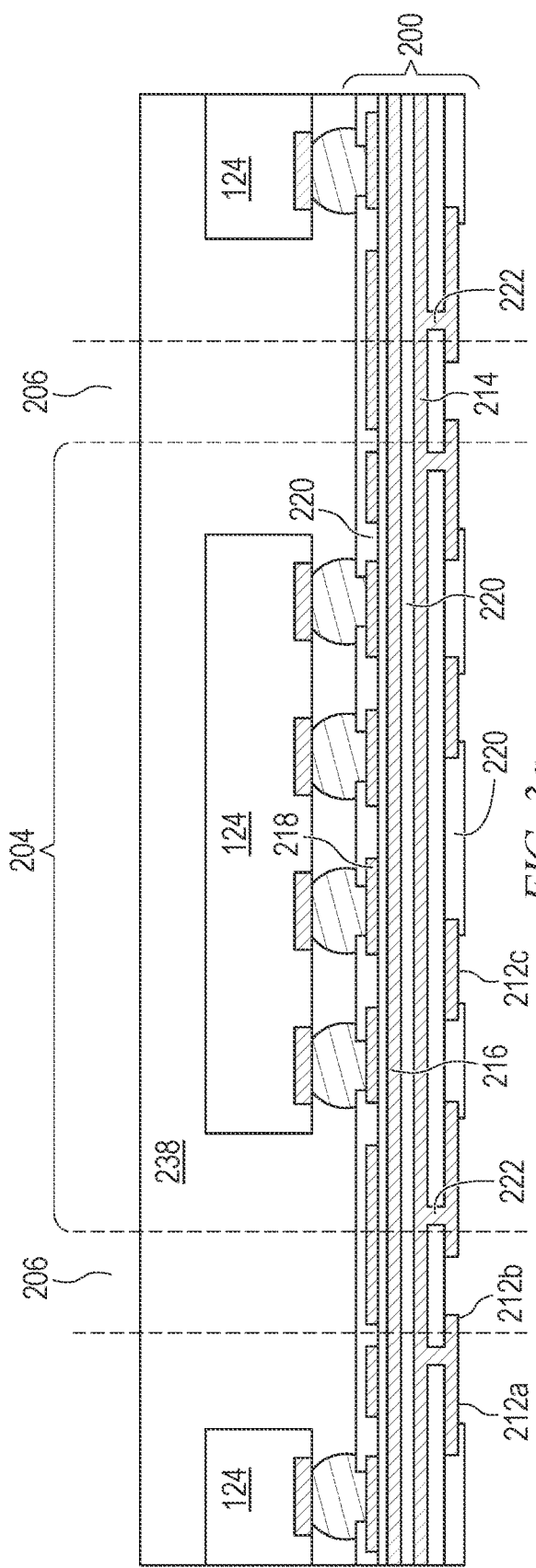

Back-end manufacturing commonly involves disposing singulated semiconductor die and other electrical components over a package substrate. Multiple packages are formed at once over a substrate strip 200 as shown in FIG. 3a. The individual packages 204 are separated by saw streets 206. Any components desired to be included in semiconductor packages 204 are mounted to substrate strip 200 between saw streets 206. The components can include one or more semiconductor die 124, separately packaged semiconductor devices, discrete active or passive components, integrated passive devices formed in metal layers on substrate strip 200, semiconductor die 124, or another substrate, any other electrical component, or any combination of the aforementioned. Additional unit or strip substrates can be stacked over substrate strip 200 and connected by vertical interconnect structures to provide room for additional electrical components without significantly increasing the footprint of packages 204. Semiconductor packages with multiple interconnected components may be referred to as system-in-package (SiP) devices.

Substrate strip 200 includes conductive layers 212a-212c, 214, 216, and 218 interleaved with insulating layers 220. Substrate strip 200 can be any suitable type of substrate, and formed in any suitable manner. Substrate strip 200 is formed using a copper-clad laminate in some embodiments. Conductive layers 212a-212c, 214, 216, and 218 include conductive traces and contact pads to electrically interconnect semiconductor die 124 and other components mounted on substrate strip 200 to each other and to other external devices through contact pads of conductive layer 212a-212c. Conductive layers 212a-212c, 214, 216, and 218 are vertically connected to each other by conductive vias 222 extending through insulating layers 220.

Figure 3B:
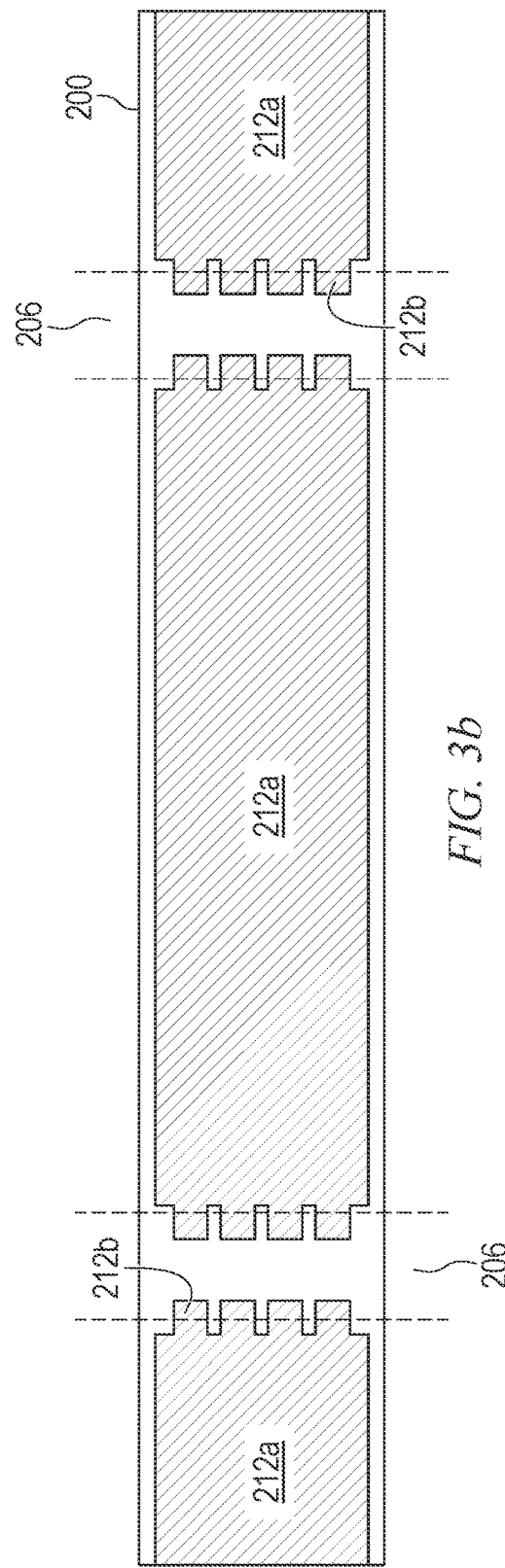

Conductive layer 212a-212c includes a ground plane 212a, tabs 212b, and contact pads 212c. Contact pads 212c are formed in openings of ground plane 212b, or outside of a footprint of the ground plane, to electrically isolate the signal path from ground. Contact pads 212c are not shown in the plan views of FIGS. 3b and 3d for simplicity. Tabs 212b extend into saw streets 206 so that side surfaces of the tabs are exposed when substrate strip 200 is singulated. Tabs 212b function similarly to bridges 112b above, by providing electrical connection to an EMI shielding layer formed over side surfaces of substrate strip 200.

However, unlike bridges 112b in the prior art, tabs 212b extend only just over the boundary into saw streets 206 without extending continuously between adjacent ground planes 212a. In one embodiment, each tab 212b is 150 micrometers (μm) across in the direction parallel to saw street 206 with 50 μm between adjacent tabs, and each tab extends approximately 50 μm into a 250 μm wide saw street. In other embodiments, tabs 212b are any suitable size, are separated by any suitable distance, and protrude into saw streets 206 by any suitable length. Each semiconductor package 204 has separate tabs 212b that extend to within saw street 206 but do not connect to the tabs or ground planes of other units. An area in the middle of saw streets 206 around each package 204 is devoid of conductive layer 212a-212c. Each individual tab 212b extends less than half-way across a saw street 206 so that tabs directly across from each other do not contact each other.

Figures 3C, 3D:
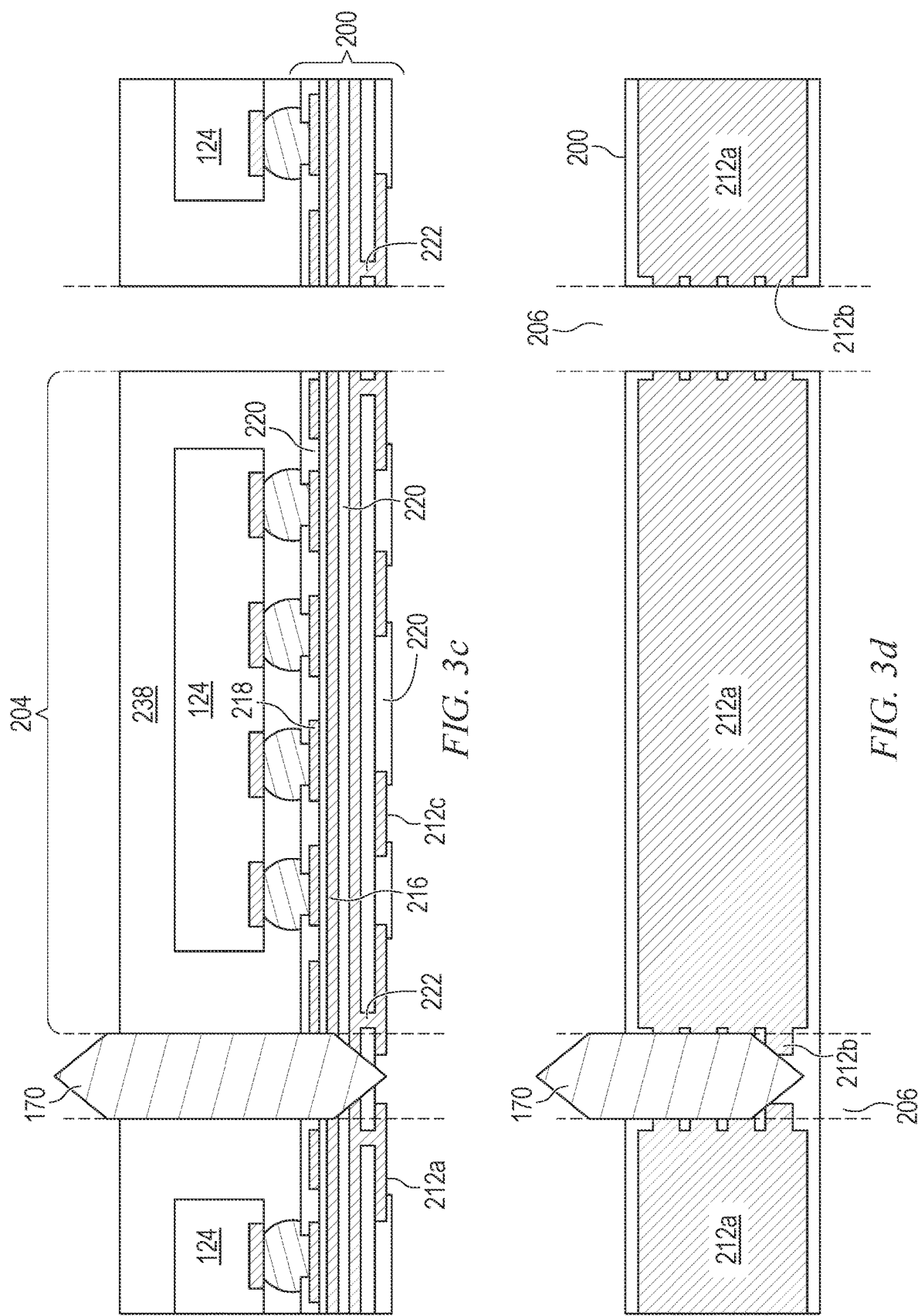

When substrate strip 200 is singulated into individual units using saw blade 170, as shown in FIGS. 3c and 3d, portions of tabs 212a within saw streets 206 are removed to ensure that the ground connections are exposed at the side of the unit substrate. However, the amount of conductive material affected is significantly reduced by not having tabs 212b extend continuously between consecutive units as with bridges 112b. The reduction in the conductive material moved by saw 170 significantly reduces the production of burrs during sawing. The risk of inadvertent electrical short circuit of signals to ground is reduced accordingly. The use of discontinuous tabs 212b reduces the volume of metal within saw street 206 to reduce burrs while still maintaining exposed ground contacts at the edges of the substrate units.

After singulation to separate individual semiconductor packages 204, FIG. 3e shows EMI shield 250 formed over the packages by physical vapor deposition (PVD), chemical vapor deposition (CVD), other sputtering methods, or any other suitable thin film deposition technique. EMI shield 250 is formed from copper (Cu), gold (Au), iron (Fe), combinations thereof, or any other suitable material for EMI shielding. The bottoms of packages 204 remain free from EMI shield 250 because the semiconductor packages are disposed on a carrier that blocks deposition of metal on the bottom surface, or because sputtering occurs from the top of the packages only.

EMI shield 250 is physically and electrically connected to conductive layer 212 because saw 170 exposed tabs 212b at the side surfaces of packages 204. EMI shield 250 is deposited directly onto side surfaces of conductive layer 212, insulating layers 220, and encapsulant 238. EMI shield 250 is optionally deposited directly onto side surfaces of conductive layers 214, 216, and 218 in embodiments where portions of those conductive layers are desired to be coupled to ground.

In FIG. 3f, an electrically conductive bump material is deposited over conductive layer 212a-212c using an evaporation, electrolytic plating, electroless plating, ball drop, or screen printing process. The bump material can be Aluminum (Al), Tin (Sn), Nickel (Ni), Au, Silver (Ag), Lead (Pb), Bismuth (Bi), Cu, solder, or combinations thereof, with an optional flux solution. For example, the bump material can be eutectic Sn/Pb, high-lead solder, or lead-free solder. The bump material is bonded to conductive layer 212a-212c using a suitable attachment or bonding process. In some embodiments, the bump material is reflowed by heating the material above its melting point to form balls or bumps 254. In one embodiment, bump 254 is formed over an under bump metallization (UBM) having a wetting layer, a barrier layer, and an adhesion layer. Bump 254 can also be compression bonded or thermocompression bonded to conductive layer 212a-212c.

Bump 254 represents one type of interconnect structure that can be formed over conductive layer 112. The interconnect structure can also use bond wires, conductive paste, stud bump, micro bump, or other electrical interconnect. Bumps 254 can be formed before or after singulation, and before or after formation of EMI shield 250. In other embodiments, no bumps are formed, and contact pads of conductive layer 212a-212c remain exposed as lands in a land grid array.

Semiconductor package 204 includes EMI shielding layer 250 formed over and completely covering top and side surfaces of the semiconductor packages. Ground plane 212a provides EMI shielding for the bottom of package 204. Having tabs 212b extending only partially into saw streets 206 during manufacture results in semiconductor package 204 having increased reliability. Burrs formed by saw 170, which may cause electrical short circuits or modify the physical shape of package 204 outside of allowable tolerances, are reduced. Conductive layer 212a-212c is a more uniform thickness because less conductive material from within saw street 206 is forced outward into the remaining portions of the conductive layer. Semiconductor package 204 is a shielded SiP module including any suitable combination of electrical components in some embodiments.

Figure 4A:
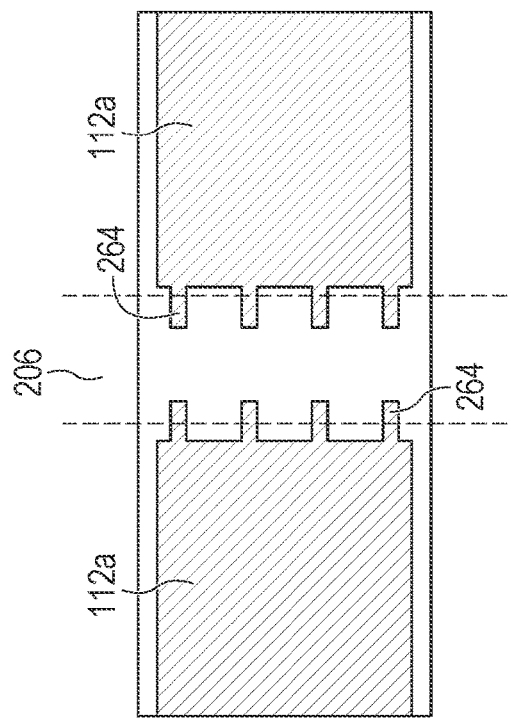
FIGS. 4a-4d illustrate grounding tabs of various widths, densities, and distributions.
Figure 4B:
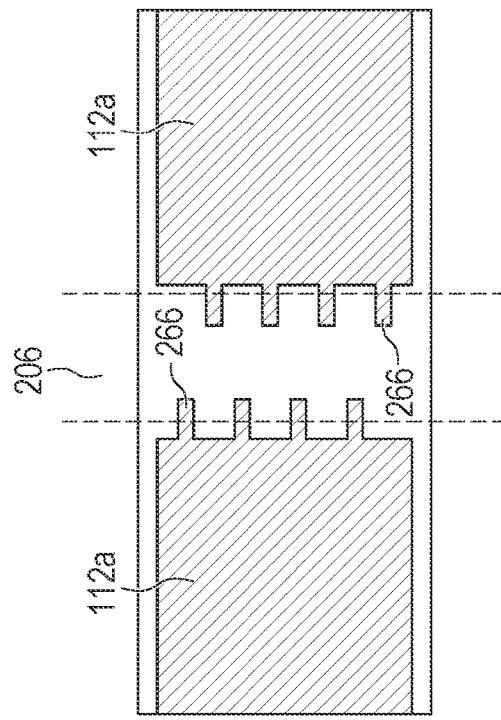
Figure 4C:
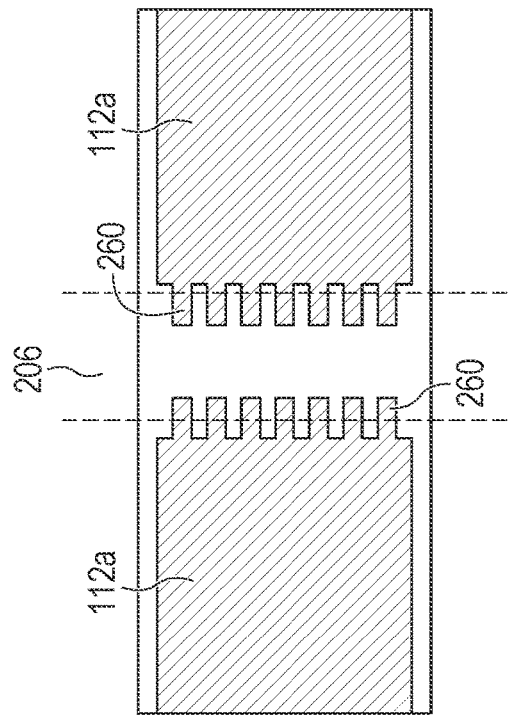

FIGS. 4a-4d illustrate various options for grounding tab widths, densities, and distributions. In FIG. 4a, tabs 260 are formed with approximately the same size of gap between the tabs as with tabs 212b above, i.e., a 50 μm gap, but the widths of the tabs are cut approximately in half, i.e., down from 150 μm to 75 μm. Therefore, the embodiment in FIG. 4a has about twice as many tabs 260 as tabs 212b for the same length of saw street 206. FIG. 4b shows an embodiment with tabs 262 that are wide like tabs 212b, but with a smaller gap between adjacent tabs. The embodiment of FIG. 4b has the same number of tabs 262 as tabs 260 in FIG. 4a, but significantly more of the overall length of the unit edge is occupied by the wider tabs. FIG. 4c shows tabs 264, which are relatively thin as with tabs 260 in FIG. 4a but spread out like with tabs 212b.

Figure 4D:
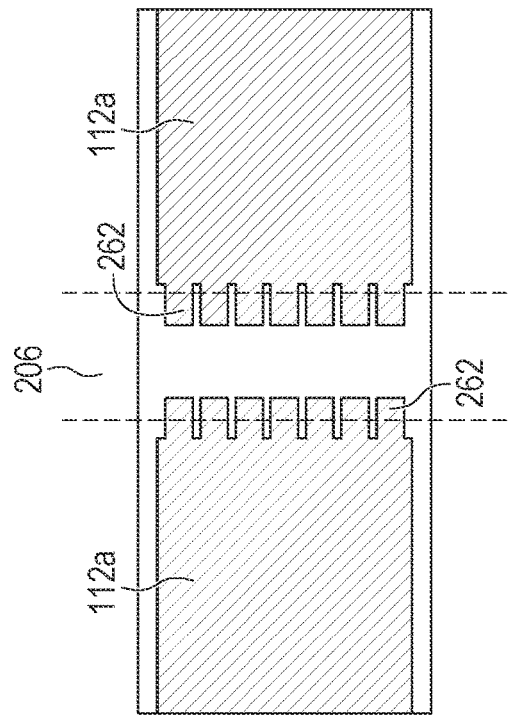

While the above embodiments all include tabs of adjacent units formed directly across from each other, other embodiments have offset tabs as with tabs 266 in FIG. 4d. Grounding tabs can be formed in any suitable pattern without regard to position relative to other tabs of the same unit or other units. The overall design can be any regular pattern, an irregular distribution, or randomly distributed.

Figure 5:
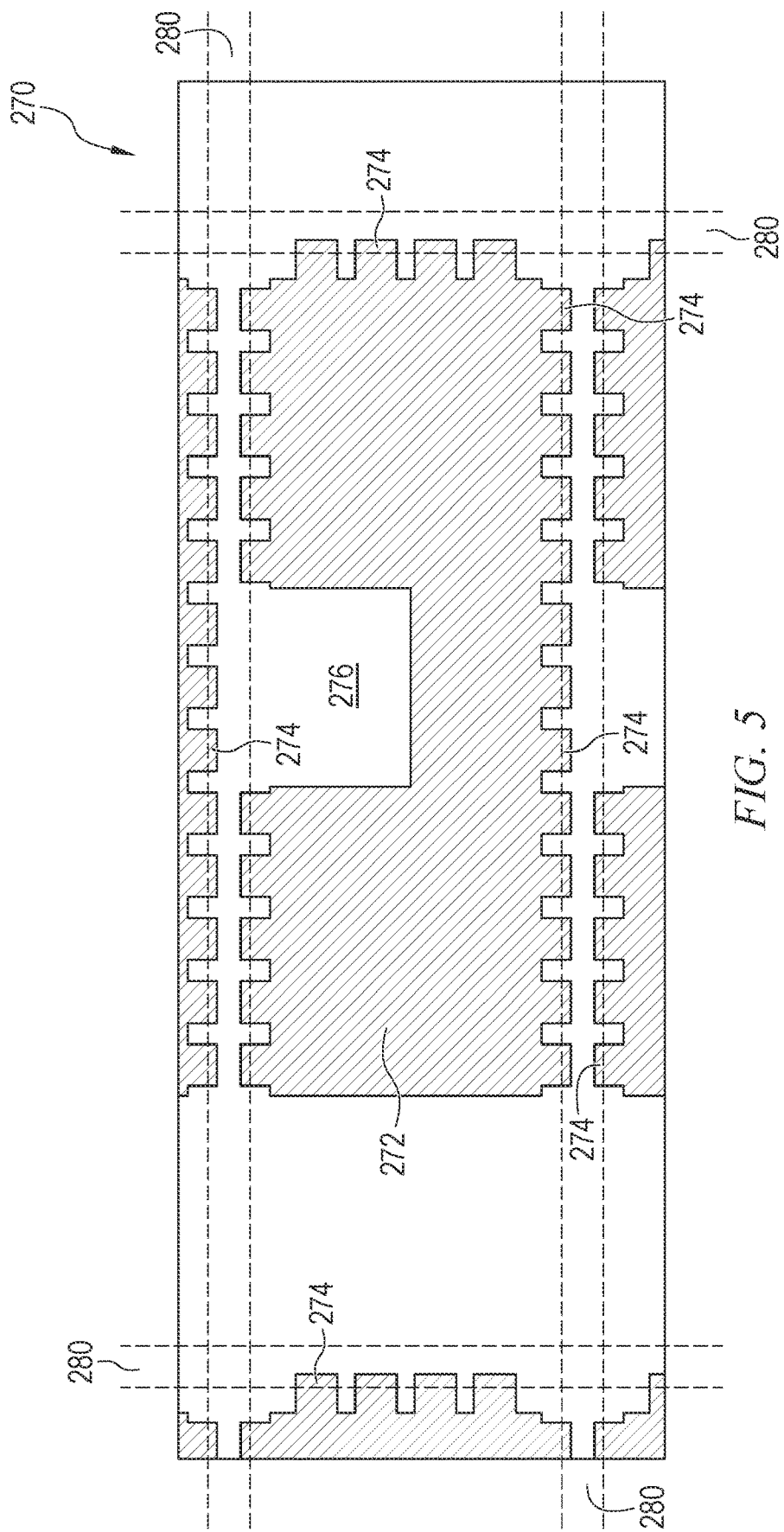
FIG. 5 illustrates a ground plane that covers only a portion of the package bottom.

FIGS. 3b, 3d, and 4a-4d show ground planes covering essentially an entire unit and tabs formed on one or two entire sides of the ground plane. However, ground planes are also commonly formed over only select portions of a device as necessary or desired. The ground plane will normally have at least one area that extends near an edge of each unit for tabs to extend into the saw streets. FIG. 5 shows a partial plan view of one example of a substrate strip 270 with ground plane 272 covering only a portion of each unit. Ground plane 272 only covers approximately the right-most three quarters of each unit. The bottom and right edges of ground plane 272 have tabs 274 along the entire lengths of those edges of the ground plane. The top edge has a cut-out 276 where a portion of the unit along the top edge is not covered by ground plane 272. The top edge of ground plane 272 has a split in tabs 274. Two groups of tabs 274 on the upper edge are formed, with one group on either side of cut-out 276. Ground plane 272 can be formed in any pattern, and tabs 274 are formed at any or all portions of the ground plane edges that are near saw streets 280.

FIGS. 6a-6e illustrate alternative shapes for grounding tabs. Tab 302 in FIG. 6a includes a rectangular portion 304 directly adjacent to ground plane 300 and a right triangle portion 306 connected to the ground plane through the rectangular portion. The edge of saw street 308 extends through right triangle portion 306, with the right triangle becoming thinner farther into the saw street. The triangular shape reduces the total amount of material in saw street 308, which reduces burr production further.

The hypotenuse of triangle portion 306 is positioned opposite the direction of force received from saw 170, helping resist the force of the saw and further reduce burrs. The edge of triangle portion 306 opposite the hypotenuse is coplanar with an edge of rectangular portion 304, and is the edge that initially receives the force of saw 170. The force of saw 170 can be applied in the opposite direction, and a benefit is still observed from the thinning of tab 302 into saw street 308 reducing the total amount of metal within the saw street.

FIG. 6b shows contact 310 with rectangular portion 312 adjacent to ground plane 300 and elliptical portion 314 extending into saw street 308. FIG. 6c shows contact 320 with rectangular portion 322 adjacent to ground plane 300 and parallelogram portion 324 extending into saw street 308. FIG. 6d illustrates tab 330 with a single parallelogram portion extending from ground plane 300 and into saw street 308. A tab could also be formed with a single elliptical or triangular portion extending all the way from ground plane 300 to saw street 308.

FIG. 6e illustrates tab 340 with a rectangular portion 342 adjacent to ground plane 300 and a triangular portion 344 extending into saw street 308. Triangular portion 344 is an isosceles triangle with the two edges extending into saw street 308 having the same length. Any suitable triangle shape can be used in other embodiments, e.g., equilateral or scalene, with two angles of triangular portion 344 against rectangular portion 342 and one angle of the triangular portion in saw street 308. All of the embodiments shown in FIGS. 6a-6e include shapes that thin into saw street 308 to reduce the overall amount of material in the saw street in addition to only extending partially into the saw street.

Figure 7A:
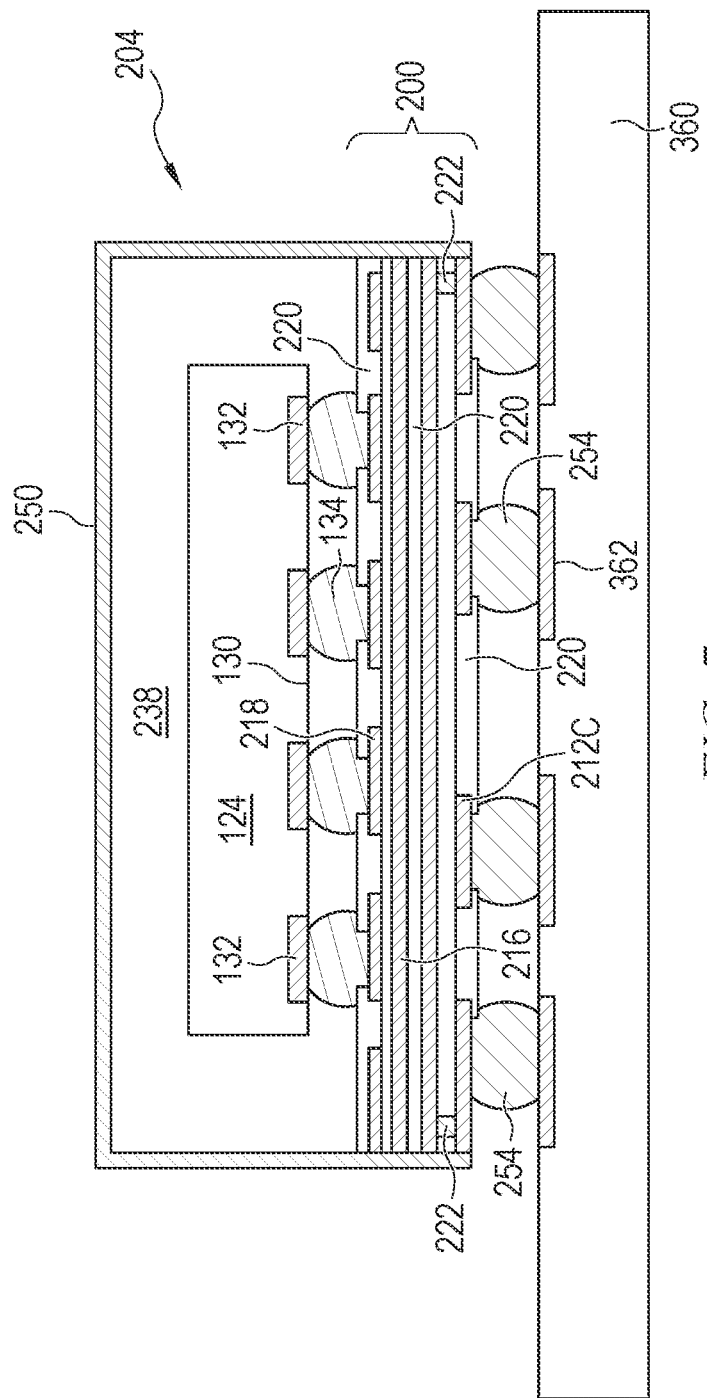
FIGS. 7a and 7b illustrate one of the shielded semiconductor packages incorporated into an electronic device.
Figure 7B:
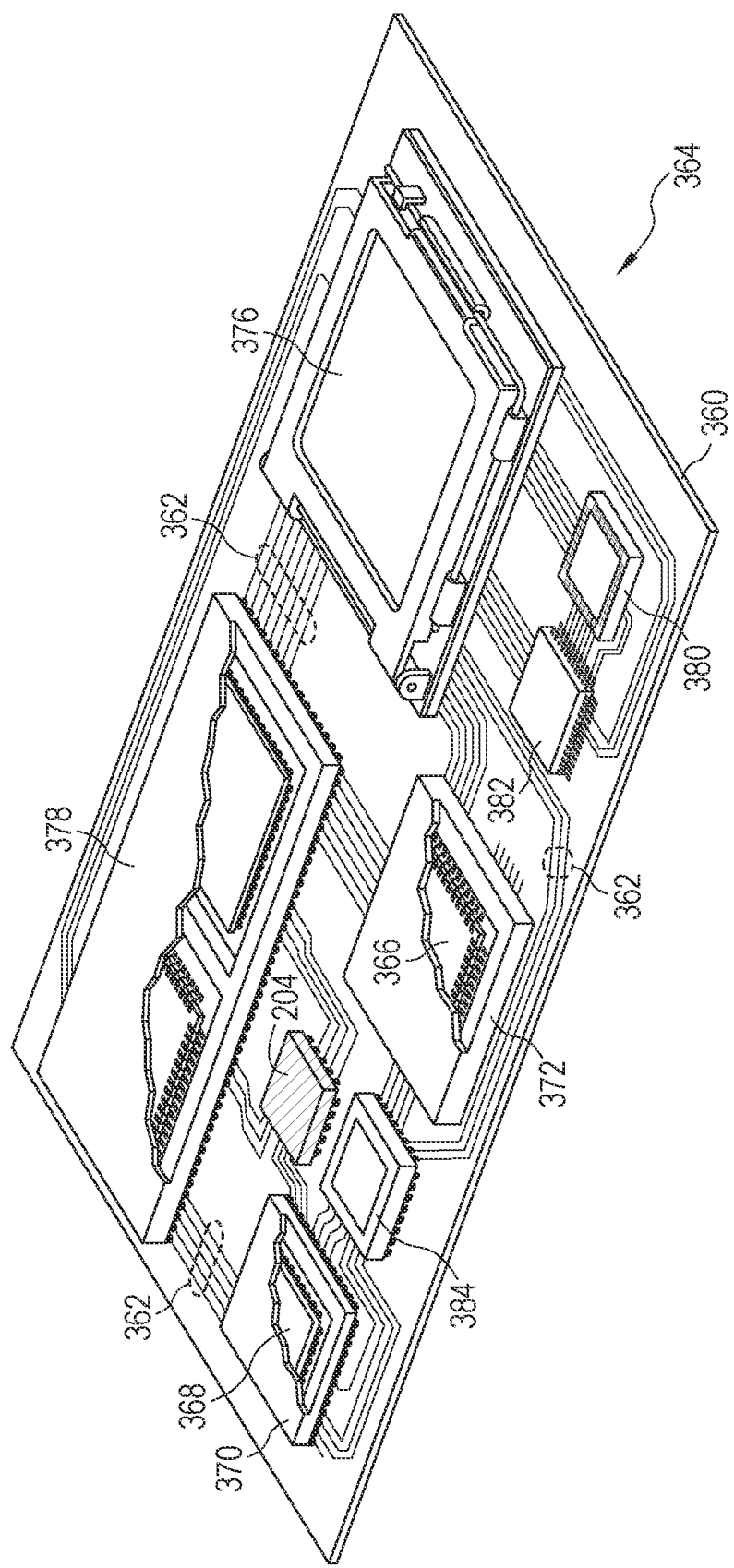

FIGS. 7a and 7b illustrate incorporating the above described packages, e.g., package 204, into an electronic device. FIG. 7a illustrates a partial cross-section of package 204 from FIG. 3f mounted onto a PCB or other substrate 360 as part of an electronic device. Bumps 254 are reflowed onto conductive layer 362 of PCB 360 to physically attach and electrically connect package 204 to the PCB. In other embodiments, thermocompression or other suitable attachment and connection methods are used. In some embodiments, an adhesive or underfill layer is used between package 204 and PCB 360. Semiconductor die 124 is electrically coupled to conductive layer 362 through bumps 254, conductive layers 212a-212c, 214, 216, and 218, and bumps 134.

FIG. 7b illustrates electronic device 364 including PCB 360 with a plurality of semiconductor packages mounted on a surface of the PCB, including package 204. Electronic device 364 can have one type of semiconductor package, or multiple types of semiconductor packages, depending on the application.

Electronic device 364 can be a stand-alone system that uses the semiconductor packages to perform one or more electrical functions. Alternatively, electronic device 364 can be a subcomponent of a larger system. For example, electronic device 364 can be part of a tablet computer, cellular phone, digital camera, communication system, or other electronic device. Electronic device 364 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 7b, PCB 360 provides a general substrate for structural support and electrical interconnection of the semiconductor packages mounted on the PCB. Conductive signal traces 362 are formed over a surface or within layers of PCB 360 using evaporation, electrolytic plating, electroless plating, screen printing, or other suitable metal deposition process. Signal traces 362 provide for electrical communication between the semiconductor packages, mounted components, and other external systems or components. Traces 362 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 360. In other embodiments, a semiconductor device may only have the first level packaging where the die is mechanically and electrically mounted directly to PCB 360.

For the purpose of illustration, several types of first level packaging, including bond wire package 366 and flipchip 368, are shown on PCB 360. Additionally, several types of second level packaging, including ball grid array (BGA) 370, bump chip carrier (BCC) 372, land grid array (LGA) 376, multi-chip module (MCM) 378, quad flat non-leaded package (QFN) 380, quad flat package 382, and embedded wafer level ball grid array (eWLB) 384 are shown mounted on PCB 360 along with package 204. Conductive traces 362 electrically couple the various packages and components disposed on PCB 360 to package 204, giving use of the components within package 204 to other components on the PCB.

Depending upon the system requirements, any combination of semiconductor packages, configured with any combination of first and second level packaging styles, as well as other electronic components, can be connected to PCB 360. In some embodiments, electronic device 364 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   forming a substrate including a saw street; and
   patterning a conductive layer of the substrate to include,
      a first ground plane,
      a first tab extending from the first ground plane only partially across the saw street, wherein a widest portion of the first tab is disposed outside of the saw street and a thinner portion of the first tab is located between the widest portion and the saw street,
      a second ground plane, wherein the first tab extends toward the second ground plane, and
      a plurality of second tabs extending from the second ground plane toward the first ground plane, wherein each of the second tabs is offset from the first tab.

2. The method of claim 1, further including patterning the first tab to include a rectangular portion outside the saw street.

3. The method of claim 1, further including patterning the first tab to include an elliptical portion.

4. A method of making a semiconductor device, comprising:
   forming a first conductive layer; and
   patterning the first conductive layer to include,
      a first ground plane,
      a second ground plane, and
      a first tab extending from the first ground plane toward the second ground plane, wherein the first tab extends only partially across a saw street between the first ground plane and second ground plane such that a gap remains between an end of the first tab and the second ground plane.

5. The method of claim 4, further including patterning the first tab to include a first width where the first tab meets the first ground plane and a second width less than the first width.

6. The method of claim 4, further including patterning the first tab to include a triangular portion.

7. The method of claim 4, further including patterning the first tab to include a trapezoidal portion.

8. The method of claim 4, further including patterning the first conductive layer to include a second tab extending from the second ground plane toward the first ground plane.

9. The method of claim 8, further including patterning the first conductive layer with the first tab and second tab aligned to each other.

10. The method of claim 4, further including patterning the first conductive layer to include a plurality of second tabs extending from the second ground plane toward the first ground plane.

11. The method of claim 10, wherein each of the second tabs is offset from the first tab.

12. A semiconductor substrate, comprising:
   a saw street; and
   a conductive layer including,
      a first ground plane,
      a first tab extending from the first ground plane only partially across the saw street, wherein a widest portion of the first tab is disposed outside of the saw street and a thinner portion of the first tab is located between the widest portion and the saw street,
      a second ground plane, wherein the first tab extends toward the second ground plane, and a plurality of second tabs extending from the second ground plane toward the first ground plane, wherein each of the second tabs is offset from the first tab.

13. The semiconductor substrate of claim 12, wherein the first tab includes a rectangular portion outside the saw street.

14. The semiconductor substrate of claim 12, wherein the first tab includes an elliptical portion.

15. A semiconductor substrate, comprising:
a plurality of insulating layers;
a first conductive layer formed between two of the plurality of insulating layers; and
a second conductive layer formed over the plurality of insulating layers, wherein the second conductive layer is patterned to form,
a first ground plane disposed adjacent to a saw street of the substrate,
a second ground plane disposed adjacent to the saw street opposite the first ground plane, and
a first tab extending from the first ground plane and only partially across the saw street toward the second ground plane such that a gap remains between an end of the first tab and the second ground plane.

16. The semiconductor substrate of claim 15, wherein the first tab includes a first width where the first tab meets the first ground plane and a second width less than the first width.

17. The semiconductor substrate of claim 15, wherein the first tab includes a triangular portion.

18. The semiconductor substrate of claim 15, wherein the first tab includes a trapezoidal portion.

19. The semiconductor substrate of claim 15, further including a plurality of second tabs extending from the second ground plane toward the first ground plane.

20. The semiconductor substrate of claim 19, wherein each of the second tabs is offset from the first tab.

* * * * *